(12) United States Patent
Zurek et al.

(10) Patent No.: US 11,454,678 B2
(45) Date of Patent: Sep. 27, 2022

(54) ELECTRICAL PLUG AND METHODS FOR TESTING AN ELECTRICAL MAINS SOCKET AND AN ELECTRICAL MAINS PLUG

(71) Applicant: Megger Instruments Ltd, Dover (GB)

(72) Inventors: Stanislaw Zurek, Dover (GB); Mark Hadley, Dover (GB); Jeffrey Jones, Dover (GB)

(73) Assignee: Megger Instruments Ltd, Dover (GB)

( * ) Notice: Subject to any disclaimer, the term of this patent is extended or adjusted under 35 U.S.C. 154(b) by 0 days.

(21) Appl. No.: 17/124,298

(22) Filed: Dec. 16, 2020

(65) Prior Publication Data

US 2021/0103008 A1 Apr. 8, 2021

Related U.S. Application Data

(63) Continuation of application No. PCT/GB2019/051689, filed on Jun. 17, 2019.

(30) Foreign Application Priority Data

Jun. 18, 2018 (GB) .................................. 1809969

(51) Int. Cl.
*G01R 31/69* (2020.01)
*G01R 1/04* (2006.01)

(52) U.S. Cl.
CPC ........... *G01R 31/69* (2020.01); *G01R 1/0408* (2013.01)

(58) Field of Classification Search
CPC ...... G01R 31/69; G01R 1/0408; G01R 31/66; G01R 31/02; G01R 31/04; G01R 31/024;
(Continued)

(56) References Cited

U.S. PATENT DOCUMENTS

2008/0122447 A1* 5/2008 Montgomery ......... G01R 27/16
324/542
2014/0190005 A1 7/2014 Hatch et al.
(Continued)

FOREIGN PATENT DOCUMENTS

DE 202015103307 U1 8/2015
DE 202016101839 U1 5/2016
(Continued)

OTHER PUBLICATIONS

United Kingdom Combined Search and Examination Report dated Nov. 28, 2018 for GB Application No. 1809969.7.
(Continued)

*Primary Examiner* — Son T Le
(74) *Attorney, Agent, or Firm* — EIP US LLP

(57) ABSTRACT

An electrical plug for testing an electrical mains socket is provided. The plug comprises a pin for engagement with a pin receptor of the mains socket. The pin comprises first and second electrical contacts, each comprising a surface portion to engage with a different respective region of the receptor. The first and second contacts are electrically isolated from one another at the pin. An electrical testing system and a method of testing an electrical mains socket is provided. The testing system comprises the electrical plug and a first circuit connected to the contacts and configured to measure an electrical resistance therebetween. The method includes providing the electrical plug and measuring an electrical resistance between the electrical contacts. A further method is provided for testing an electrical mains plug comprising a pin, by providing an electrical socket with a pin receptor having first and second regions electrically isolated from one another.

15 Claims, 7 Drawing Sheets

(58) Field of Classification Search
CPC .. G01R 31/025; G01R 31/026; G01R 31/281; G01R 31/045; G01R 22/068; G01R 31/327; G06F 11/221; G06F 11/07
See application file for complete search history.

(56) References Cited

U.S. PATENT DOCUMENTS

| | | |
|---|---|---|
| 2015/0015294 A1 | 1/2015 | Tan et al. |
| 2016/0274168 A1* | 9/2016 | Cabot ................... G06F 11/221 |

FOREIGN PATENT DOCUMENTS

| | | |
|---|---|---|
| DE | 202017107108 U1 | 12/2017 |
| GB | 0775488 A | 5/1957 |
| GB | 2192066 A | 12/1987 |
| GB | 2257797 A | 1/1993 |
| GB | 2499514 A | 8/2013 |
| KR | 101751710 B1 | 7/2017 |

OTHER PUBLICATIONS

United Kingdom Search Report dated May 13, 2019 for GB Application No. 1809969.7.
United Kingdom Search Report dated May 10, 2019 for GB Application No. 1809969.7.
International Search Report and Written Opinion dated Jan. 13, 2020 for PCT Application No. PCT/GB2019/051689.

* cited by examiner

ELECTRICAL PLUG AND METHODS FOR TESTING AN ELECTRICAL MAINS SOCKET AND AN ELECTRICAL MAINS PLUG

CROSS-REFERENCE TO RELATED APPLICATIONS

This application is a continuation of International Application No. PCT/GB2019/051689, filed Jun. 17, 2019 which claims priority to UK Application No. GB 1809969.7, filed Jun. 18, 2018, under 35 U.S.C. § 119(a). Each of the above-referenced patent applications is incorporated by reference in its entirety.

BACKGROUND OF THE INVENTION

Field of the Invention

The present invention relates to an electrical plug for testing an electrical mains socket, in particular an electrical plug comprising a pin for engagement with a pin receptor of the electrical mains socket, the pin having first and second electrical contacts electrically isolated from one another at the pin, and to a method for testing an electrical mains socket. The present invention also relates to a method for testing an electrical mains plug.

Description of the Related Technology

Electric power is typically transported and delivered to premises in the form of mains electricity, as a general-purpose alternating-current (AC) electric power supply.

At a premises, the mains electricity may be accessed via electrical mains sockets (also known as an AC power socket, socket-outlet, electrical outlet, wall socket, wall outlet, plug socket, power point, and electrical receptacle, among other terms) which are connected to an energised electrical circuit, comprising part of the mains, in the premises.

Devices that operate using electricity, for example electric appliances, can be connected to the mains via an electric plug, also known as an AC power plug, which is coupled to the device, interacting with a mains socket, which may be referred to as a socket-outlet.

The IEC 60050 International Electrotechnical Vocabulary standard, published by the International Electrotechnical Commission (IEC), defines a plug as an accessory having pins designed to engage with the contacts of a socket-outlet, also incorporating means for the electrical connection and mechanical retention of flexible cables or cords. The plug is typically coupled to the device by the flexible electrical cable or cables, thus being moveable relative to the device to plug into the socket.

IEC 60050 defines a socket-outlet as an accessory having socket-contacts designed to engage with the pins of a plug and having terminals for the connection of cables or cords. The pin and socket contacts are thus a complementary set of conductive elements for establishing electric circuit continuity when they touch each other and which, due to their relative motion during an operation, open or close an electric circuit. For example, when the pins of the plug are engaged with the socket contacts of the socket-outlet, an electric circuit is closed and the plugged device is connected to the mains.

Specifically, and according to IEC 60050, each socket contact, also known as a female contact, of the socket-outlet is a contact member intended to make electric engagement on its inner surface for mating with the outer surface of another contact member. Each pin contact, also known as a male contact, is correspondingly a contact member intended to make electric engagement on its outer surface for mating with the inner surface of another contact member. Thus, the outer surface of a pin contact is configured to make electric engagement with the inner surface of a socket contact when mated therewith.

The terminals of the socket may connect to electrical cables or cords to connect the socket to the mains supply. Electrical sockets generally provide either two or three terminals for the conductors of the mains supply. Sockets configured to receive two-pin plugs normally provide terminals for neutral and line conductors, both of which carry current in use. The neutral conductor is usually very near to earth potential, while the line conductor carries the supply voltage, measured relative to the neutral potential.

Sockets configured to receive three-pin plugs may additionally include a terminal for a protective earth conductor, also known as an earthing or grounding conductor, which provides at least part of a conductive path between a given point in a system, for example an installation or device, and an earth electrode. The protective earth conductor may connect exposed metal parts of an appliance to the earth electrode, which is at the electrical potential of the Earth, also known as reference earth or reference ground; conventionally taken as zero. Three-pin plugs may thus include a corresponding protective earth pin to engage with the socket-contact having the terminal for the protective earth conductor.

The characteristics of electrical plugs and sockets vary between regions around the world, corresponding to the differences between properties of the electric power supply, e.g. the voltage and frequency thereof. For example, the number of pins and socket-contacts, the shape of the pins on the plug, the electric potential that each conductor connected to a pin-socket contact pair carries, all vary and are region-dependent. Plugs and sockets are nationally standardised, but the IEC catalogues the different standards that apply in member countries of the IEC and maintains a list of world plug types.

An adaptor may be used to make a plug of one type compatible with a socket of another type. According to IEC 60050, an adaptor is a portable accessory constructed as an integral unit incorporating both a plug portion and one or more socket-outlet portions.

SUMMARY

In accordance with a first aspect of the present invention, there is provided an electrical plug for testing an electrical mains socket, when engaged therewith, the electrical plug comprising a pin for engagement with a pin receptor of the electrical mains socket, wherein the pin comprises first and second electrical contacts, each comprising a surface portion to engage with a different respective region of the pin receptor when the pin is engaged with the pin receptor, the electrical contacts being electrically isolated from one another at the pin.

This allows the plug to be used for electrical test measurements that can identify defective socket contacts in an electrical mains socket. The plug according to the present invention also allows for improved (four-terminal) electrical resistance measurements of an electrical installation which the mains socket is a part of. Such measurements may be made without nulling any lead resistances.

In an embodiment, the electrical plug comprises a first circuit connected to the first and second electrical contacts, and configured to measure an electrical resistance therebetween.

This allows an electrical resistance measurement across the electrical contacts of the pin, when engaged with the pin receptor, to be made at the plug.

In an embodiment, the first and second electrical contacts are separated by an intermediate portion of the pin.

This allows a geometric separation of the electrical contacts such that they engage with the different regions of the pin receptor when the pin is engaged therewith.

In an embodiment, the first and second electrical contacts are diametrically opposed to one another. This allows for the electrical contacts to engage with different regions of the pin receptor on opposite sides thereof. For example, where the pin receptor has two contact blades extending inside the socket and opposing one another, in accordance with certain socket types, the diametrically opposed electrical contacts of the pin may each electrically engage with a respective contact blade of the pin receptor.

In an embodiment, the pin is a first pin and the electrical plug comprises a second pin for engagement with a further pin receptor of the electrical mains socket, wherein the second pin comprises third and fourth electrical contacts, each comprising a surface portion to engage with a different respective region of the further pin receptor when the pin is engaged therewith, the third and fourth electrical contacts being electrically isolated from one another at the second pin.

This allows the plug to be used for electrical test measurements that can identify multiple defective socket contacts in an electrical mains socket. This also provides four electrical contacts on the plug, such that four-terminal sensing may be performed to measure an electrical resistance, or impedance, of an electrical installation which the mains socket is a part of.

In an embodiment, the plug comprises a second circuit connected to the third and fourth electrical contacts, and configured to measure an electrical resistance therebetween.

This allows an electrical resistance measurement across the electrical contacts of the second pin, when engaged with the further pin receptor, to be made at the plug.

In an embodiment, the plug comprises a controller and an emitter of radiation, wherein the controller is configured to: receive a measured resistance value from the first circuit; and control, based on the measured resistance value, an output of the emitter.

This allows a result of the electrical measurement to be signalled, for example to a user, at the plug.

In an embodiment, the emitter of is a light source or a transmitter of electromagnetic radiation or an emitter of an audio alert.

In an embodiment, the controller is configured to adjust the output of the emitter in response to a determination that the measured resistance value has a predetermined relationship with a resistance value threshold.

This allows the result of the electrical measurement to be signalled if it exceeds, or does not meet, the threshold, for example. This may be useful to classify defective socket contacts, for example to allow some degradation of the socket contact before indicating that it is defective and should be repaired or replaced.

In an embodiment, the plug comprises a third circuit connected to the first, second, third and fourth electrical contacts, and configured to measure, by four-wire sensing, at least one of an impedance and a resistance of an electrical installation connected to the electrical mains socket.

This allows a four-wire impedance or resistance measurement of the electrical installation to be made at the plug.

In accordance with a second aspect of the present invention, there is provided an electrical testing system for testing an electrical mains socket, the testing system comprising: an electrical plug comprising a pin for engagement with a pin receptor of the electrical mains socket, wherein the pin comprises first and second electrical contacts, each comprising a surface portion to engage with a different respective region of the pin receptor when the pin is engaged with the pin receptor, the electrical contacts being electrically isolated from one another at the pin; and a first circuit connected to the first and second electrical contacts, and configured to measure an electrical resistance therebetween.

This allows the electrical testing system to be used for electrical test measurements that can identify defective socket contacts in an electrical mains socket, and also allows four-terminal electrical resistance measurements of an electrical installation which the mains socket is a part of. The measurements may be made at the plug, or using a test device as part of the electrical testing system.

In an embodiment, the first and second electrical contacts of the pin are separated by an intermediate portion thereof.

In an embodiment, the first and second electrical contacts are diametrically opposed to one another.

In an embodiment, the pin is a first pin, and the electrical plug comprises a second pin for engagement with a further pin receptor of the electrical mains socket, and the second pin comprises third and fourth electrical contacts, each comprising a surface portion to engage with a different respective region of the further pin receptor when the pin is engaged therewith, the third and fourth electrical contacts being electrically isolated from one another at the second pin.

In an embodiment, the electrical testing system comprises a second circuit connected to the third and fourth electrical contacts, and configured to measure an electrical resistance therebetween.

In an embodiment, the electrical testing system comprises a controller and an emitter of radiation, wherein the controller is configured to: receive a measured resistance value from the first circuit; and control, based on the measured resistance value, an output of the emitter.

In an embodiment, the emitter is a light source or a transmitter of electromagnetic radiation or an emitter of an audio alert.

In an embodiment, the controller is configured to control the output of the emitter in response to a determination that the measured resistance value has a predetermined relationship with a resistance value threshold.

In an embodiment, the electrical testing system comprises a third circuit connected to the first, second, third and fourth electrical contacts and configured to measure, by four-wire sensing, at least one of an impedance and a resistance of an electrical installation connected to the electrical mains socket.

In accordance with a further aspect of the present invention, there is provided a method of testing an electrical socket comprising a pin receptor, the method comprising:
  providing an electrical plug comprising a pin for engagement with the pin receptor,
  wherein the pin comprises first and second electrical contacts, each comprising a surface portion to engage with a different respective region of the pin receptor when the pin is engaged therewith, the electrical contacts being electrically isolated from one another at the pin;

engaging the pin with the pin receptor to make electrical contact therewith; and measuring an electrical resistance between the first and second electrical contacts.

In an embodiment, the resistance is measured using a circuit connected to the first and second electrical contacts.

In an embodiment, the method comprises: receiving a resistance value measured by the circuit; and controlling, based on the measured resistance value, an output of radiation by an emitter.

In an embodiment, the method comprises: determining whether the resistance value has a predetermined relationship with a resistance value threshold; and adjusting, in response to determining that the resistance value and the resistance value threshold have the predetermined relationship, the output of radiation by the emitter. The radiation may be electromagnetic radiation.

In accordance with a further aspect of the present invention, there is provided a method of testing an electrical mains plug comprising a pin, the method comprising:

providing an electrical socket with a pin receptor having first and second regions electrically isolated from one another;

engaging the pin with the pin receptor to make electrical contact therewith; and measuring an electrical resistance between the first and second regions of the pin receptor.

In an embodiment, the resistance is measured using a circuit connected to the first and second regions of the pin receptor.

In an embodiment, the method comprises: receiving a resistance value measured by the circuit; and controlling, based on the measured resistance value, an output of radiation by an emitter.

In an embodiment, the method comprises: determining whether the resistance value has a predetermined relationship with a resistance value threshold; and adjusting, in response to determining that the resistance value and the resistance value threshold have the predetermined relationship, the output of radiation by the emitter. The radiation may be electromagnetic radiation.

Further features and advantages of the invention will become apparent from the following description of preferred embodiments of the invention, given by way of example only, which is made with reference to the accompanying drawings.

DETAILED DESCRIPTION OF CERTAIN INVENTIVE EMBODIMENTS

Figure 1:
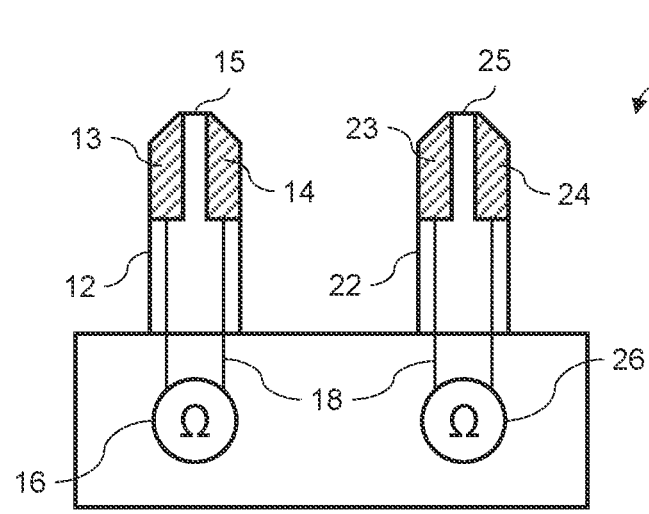
FIGS. 1 and 2 are schematic diagrams of a sectional view of an electrical plug according to embodiments of the invention.

Embodiments of the invention are herein described with reference to the accompanying drawings. In the following description, for the purpose of explanation, numerous specific details of certain examples are set forth. Reference in the specification to "an example" or similar language means that a particular feature, structure, or characteristic described in connection with the example is included in at least that one example, but not necessarily in other examples. It should further be noted that certain examples are described schematically with certain features omitted and/or necessarily simplified for ease of explanation and understanding of the concepts underlying the examples.

Electrical mains sockets can develop defective socket contacts. For example, a socket contact may become damaged by being bent or otherwise misshapen through continued use. Socket contacts may also become corroded over time, for example by an oxide layer developing on its surface. Such defective socket contacts can be unreliable for connecting electrical plugs therewith, as the socket contact may hinder electrical engagement with an inserted pin contact of the plug, thus increasing the electrical resistance at that contact. For example, a corrosion layer between the conductive layer of the socket contact and the pin may hinder electrical contact therebetween. In some cases, electrical engagement between an inserted pin contact and the defective socket contact may be prevented, for example where the socket contact is misshapen so that an inserted pin does not physically engage therewith.

Such defective mains sockets may present difficulties when testing an electrical resistance of an electrical system or installation, e.g. of a building connected to the mains, as part of an electrical impedance thereof. Electrical impedance Z of an AC system may be evaluated by the equation $Z=R+jX$, where the real part is the resistance R and the imaginary part is the reactance X.

Two-terminal (2T) sensing may be used to measure such an electrical resistance as part of the electrical impedance of the installation. Also known as two-wire testing, this may involve connecting a circuit, e.g. an ohmmeter, across a resistance under test with conducting wires, also known as test leads, to measure the resistance thereof. A test current I is applied, and the circuit, which may also be called a meter, measures a voltage V across the resistance under test. Using Ohm's law ($R=V/I$), the resistance under test R can be inferred from the test current and the voltage drop.

The resistance of an electrical system accessed by a mains socket can thus be measured via 2T sensing, by connecting such a resistance-measuring circuit, e.g. an ohmmeter, across two socket-contacts of the main socket. However, there is an additional resistance contribution from the test leads, used to connect the resistance-measuring circuit, which increases the resistance value measured by the circuit by an error value. since the voltage also drops across the lead resistances. Similarly, there can be an additional resistance contribution at the points of contact between the test leads and the resistance under test, leading to a further error value.

The relative magnitude of these error contributions increases with lower resistance measurements.

When using 2T sensing to measure the resistance of an electrical system, it may therefore be difficult to determine the resistance of the system, which may for example include the resistance of the conductors in the installation and the supplying transformer, from the measured value due to the additional contact, and in some examples lead resistances. A defective socket-contact of a mains socket, used for the 2T sensing, may thus not be detected. Additionally, the measured resistance value may vary due to an unreliable connection between the test lead, or leads, and the socket-contact, or socket-contacts, of a defective mains socket, as described above.

Furthermore, problems can arise when such defective socket contacts are put under a relatively large electrical load, as they can heat up significantly due to the increased electrical resistance at the contact, and in some cases can thereby pose a fire hazard.

The electrical plug according to the present invention allows for electrical test measurements that can identify defective socket contacts in a mains socket. The present plug also allows for improved (four-terminal) electrical resistance measurements of a system comprising the mains socket, for example without any need for nulling lead resistances.

FIGS. 1 to 5 show an electrical plug 1 for testing an electrical mains socket 2 when engaged therewith. The electrical plug 1 comprises a pin 12 for engagement with a pin receptor 4, which may also be called a socket contact, of the socket 2. The pin 12 may be an elongate protrusion of the plug for inserting into the pin receptor 4. The pin 12 includes a first electrical contact 13 and a second electrical contact 14, each electrical contact 13,14 comprising a surface portion. The electrical contacts 13, 14 are electrically isolated from one another at the pin 12, e.g. by galvanic isolation. Therefore, an electric current may not flow between the contacts 13, 14, across the pin 12, when the plug 1 is engaged with the socket 2. The surface portions of the electrical contacts 13, 14 are each to engage with a different respective region of the pin receptor 4 when the pin 12 is engaged with the pin receptor 4.

The pin receptor 4 may be a standard socket contact configured to make electric engagement on its inner surface, for mating with the outer surface of another contact member, such as a pin contact of a standard electrical plug.

The electrical contacts 13, 14 of the pin 12 on the present plug 1 may thus be considered as separate pin contacts of the same pin 12. For example, the electrical contacts 13, 14 may be separate contact members of the pin 12, each configured to make electric engagement on its outer surface, for mating with the inner surface of the pin receptor 4. The pin 12 may thus be referred to as a multi-contact pin.

The electrical contacts 13, 14 being electrically isolated from one another at the pin 12, and each comprising a surface portion configured to engage with a different respective region of the pin receptor 4 when the pin 12 is engaged therewith, allows the pin receptor 4 of the mains socket 2 to be tested. For example, a two-wire test may be performed by connecting a circuit to the electrical contacts 13, 14; engaging the pin 12 with the pin receptor 4; and measuring, with the circuit, an electrical resistance between the electrical contacts 13, 14. Based on the measured resistance value, a quality of the electrical connection between the electrical contacts 13, 14 and the pin receptor 4 may be determined.

For example, with the pin receptor 4 in working order, the two electrical contacts 13, 14 should be shorted by the pin receptor 4 and thus the measured electrical resistance should be relatively low. However, if part of the pin receptor 4 is damaged, for example bent, or corroded, for example by an oxide layer on its surface, then the measured electrical resistance value may be relatively high. Thus, a socket contact that is not in full working order can be detected by such a relatively high measured electrical resistance. In some cases, a corroded socket contact can lead to a risk of overheating and possibly fire. Methods of testing an electrical socket, according to embodiments of the invention, are described below in more detail with reference to FIG. 7.

Furthermore, the present pin 12 may be implemented as a protective earth pin, e.g. of a three-pin plug connected to an electrical device, for engaging a protective earth socket contact. In such cases, measurement of an electrical resistance between the electrical contacts 13, 14 allows for detection of a missing contact, for example one that is damaged, on the pin 12, which could constitute a risk of electrocution due to a lack of earthing, or grounding, of the electrical device.

In examples, the surface portion of each of the first and second electrical contacts 13, 14 may be portions of a single surface of the pin 12. For example, the pin 12 may comprise a cylindrical portion capped at the mating end with a hemispherical portion, and having a single surface, for example a "round" pin in accordance with certain IEC world plug types, such as C, D, E, F, J, K, L, M and N. In such cases, the surface portion of each of the contacts 13, 14 may be portions of the same, e.g. spherocylindrical, surface.

In other examples, the surface portion of each of the first and second electrical contacts 13, 14 may be portions of different surfaces of the pin 12. For example, the pin 12 may be polyhedral; comprising multiple faces and edges, for example a "rectangular" pin, or "blade", in accordance with certain IEC world plug types, such as A, B, G, H and I. In such cases, the surface portions of each of the contacts 13, 14 may be portions of different faces of the polyhedral pin 12, as shown in cross-section in FIGS. 1 to 5. In certain cases, the pin 12 may be polyhedral and the surface portions of each of the first and second electrical contacts 13, 14 may be portions of the same surface of the pin 12, e.g. portions of a face thereof.

In some examples, the first and second electrical contacts 13, 14 are separated by an intermediate portion 15 of the pin 12, as shown in FIGS. 1 to 5. For example, the intermediate portion 15 may comprise electrically insulating material to electrically isolate the electrical contacts 13, 14 from one another at the pin 12. In certain cases, the intermediate portion 15 may comprise a strip of electrically insulating material to separate and electrically isolate the contacts 13, 14. The intermediate portion 15 may separate the electrical contacts 13,14 longitudinally on the pin 12, e.g. with respect to a longitudinal axis of the pin 12. For example, the strip of electrically insulating material referred in certain cases may extend along a length of the pin 12 to separate the electrical contacts 13, 14 longitudinally either side of the strip. In particular cases, the pin 12 may comprise a sleeve at its base, for example in accordance with the BS 4573 and BS 1363 British Standards for plugs. The strip of electrically insulating material may extend from the sleeve of electrically insulating material, along the length of the pin 12, in such cases. FIGS. 1 to 5 show the pin 12 having regions below and between the electrical contacts 13, 14. These regions may comprise the sleeve and strip of electrically insulating material, respectively, in accordance with the particular examples described.

The surface of the intermediate portion 15 may be a portion of the same surface of the pin 12 as the surface portions of each of the contacts 13, 14. For example, where the pin 12 is a round pin, as described above, the surface of the intermediate portion 15 may be a portion of the same surface of the pin 12 as the surface portions of each of the contacts 13, 14—e.g. a single spherocylindrical surface. In other examples, the surface of the intermediate portion 15 may comprise a portion of a separate surface, or face, of the pin 12 to either or both of the surface portions of each of the contacts 13, 14—e.g. where the pin 12 is a rectangular pin having multiple surfaces, as described above.

The first and second electrical contacts 13, 14 may be diametrically opposed to one another. For example, the surface portion of each of the electrical contacts 13, 14 may face outwardly in substantially opposite directions. Certain types of electrical mains socket 2 include a pin receptor 4 that has two contact blade portions extending inside the socket 2 and opposing one another, as shown in FIGS. 1 to 5. The two blade portions are configured to receive a given pin contact of a given plug between them, and may be resiliently opposed to one another. Thus, the surface portion of each of the contacts 13, 14 of the pin 12 facing outwardly in substantially opposite directions may enable separate electrical contacts to be made between the contacts 13, 14 and respective blade portions of the pin receptor 4, when the plug 1 is engaged with the socket 2, as shown in FIG. 5.

Figure 3:
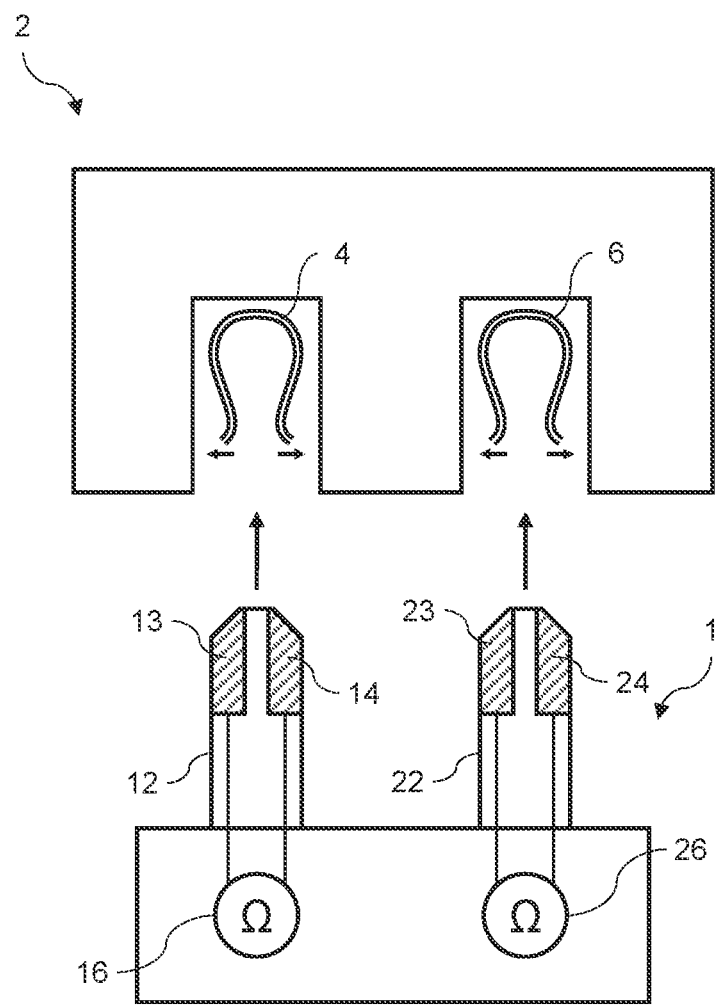
FIGS. 3 and 4 are schematic diagrams of a sectional view of an electrical plug, interacting with an electrical socket, according to embodiments of the invention.
Figure 4:
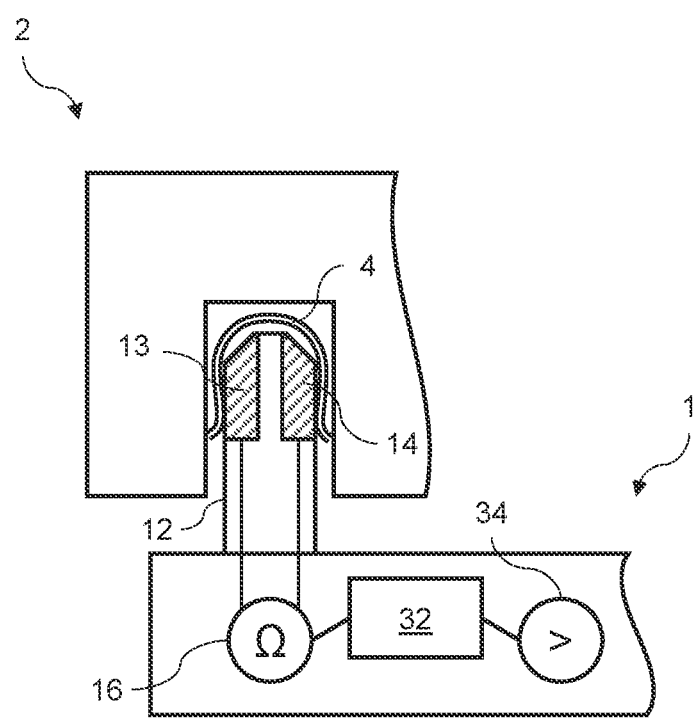
Figure 5:
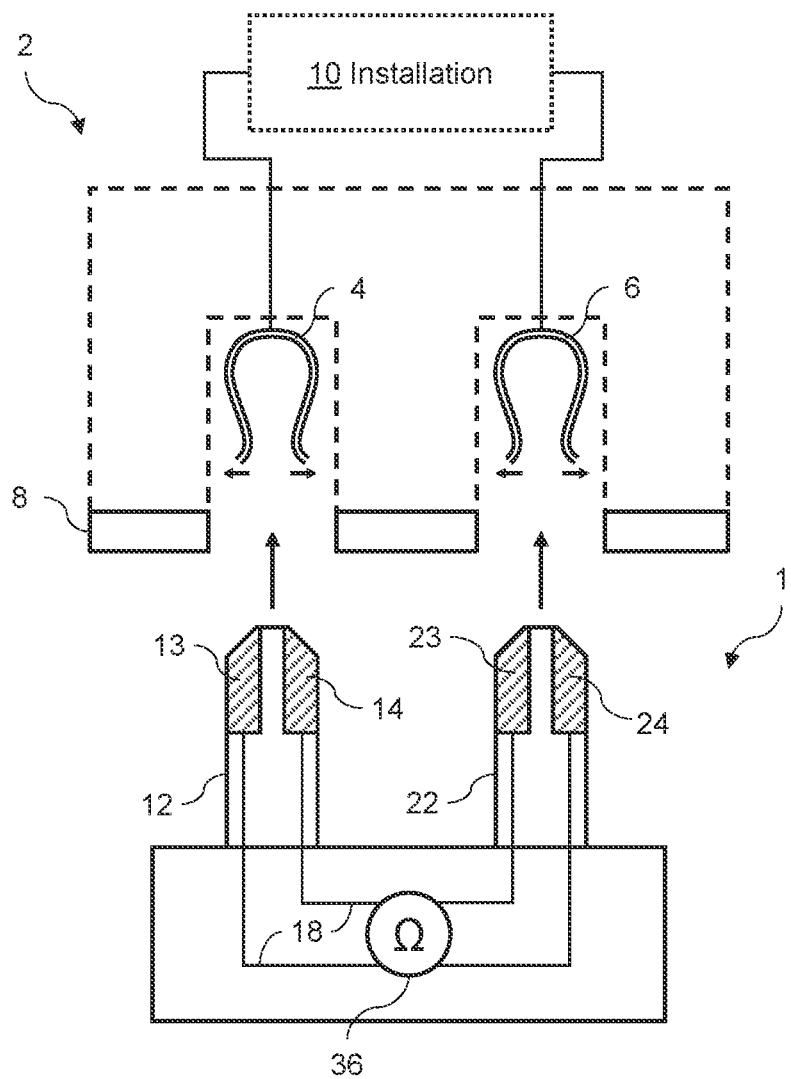
FIG. 5 is a schematic diagram of a sectional view of an electrical plug, interacting with an electrical socket connected to an electrical installation, according to embodiments of the invention.

In some examples, the electrical plug 1 includes a first circuit 16 connected to the first and second electrical contacts 13, 14, e.g. by electrical conductors 18 such as wires, as shown in FIGS. 1, 3 and 4. The first circuit 16 may be configured to measure an electrical resistance between the electrical contacts 13, 14 as described above. In examples, the first circuit 16 comprises an ohmmeter for measuring the electrical resistance, as represented in FIGS. 1, 3 and 4 by the ohm symbol $\Omega$.

FIGS. 1, 2, 3 and 5 show examples of the electrical plug 1 wherein the pin described herein is a first pin 12, and the plug 1 comprises a further, that is to say a second, pin 22. The second pin 22 is for engagement with a further, that is to say a second, pin receptor 6 of the electrical mains socket 2. The second pin 22 includes a third electrical contact 23 and a fourth electrical contact 24, each comprising a surface portion. The electrical contacts 23, 24 of the second pin 22 are electrically isolated from one another at the second pin 22. The surface portions of each of the electrical contacts 23, 24 of the second pin 22 are also configured to engage with a different respective region of the further pin receptor 6 when the pin 22 is engaged therewith.

The second pin 22, and third and fourth electrical contacts 23, 24 thereof, are similar to the first pin 12, and first and second electrical contacts 13, 14 thereof, respectively. Thus, the corresponding descriptions above may be taken to apply in examples. The first and second pins 12, 22 may correspond to the same described example, or may correspond to respective, different, described examples. For example, the first pin 12 may be a round pin and the second pin 22 may be a rectangular pin, e.g. in accordance with an IEC type B plug. In some cases, the first and second pins 12, 22 may be of different sizes in accordance with certain plug types, e.g. the ground and power pins of IEC types G and M. For example, the first pin 12 may be longer and, additionally or alternatively, may have a larger cross section than the second pin 22.

The electrical plug 1 may comprise any number of pins according to different examples. For example, the plug may comprise two or three pins in systems using a single-phase electricity supply, in accordance with certain national standards. In a system implementing a three-phase electricity supply, the plug 1 may comprise five or six pins, e.g. with three of the pins carrying currents at different phases, according to particular national standards. A subset of the total number of pins on a given electrical plug 1 may be multi-contact pins 12, 22 in accordance with examples described herein. In some examples, each pin on the given electrical plug 1 may be a multi-contact pin 12, 22 in accordance with examples described herein.

In examples, the electrical plug 1 includes a second circuit 26 connected to the third and fourth electrical contacts 23, 24 of the second pin 22. The second circuit 26 is configured to measure an electrical resistance between the third and fourth electrical contacts 23, 24. In examples, the second circuit 26 comprises an ohmmeter for measuring the electrical resistance.

In certain cases, the electrical plug 1 includes both the first and second circuits 16, 26 for measuring respective electrical resistances between the respective pairs of electrical contacts 13, 14; 23, 24. In other cases, the plug comprises either one of the first and second circuits 16, 26 but not the other.

In examples, the electrical plug 1 includes a controller 32. The controller 32 may comprise one or more processors, which may, for example, be one or more of a microprocessor, a microcontroller, a programmable gate array, an application specific integrated circuit (ASIC), a computer processor, or the like.

The controller 32 is communicatively coupled to the first circuit 16 of the plug 1 as shown in FIG. 4, which depicts partial sections of the electrical plug 1 and socket 2. The controller 32 may include a computer-readable storage medium, e.g. memory, configured to store, encode, or carry instructions that, when executed, cause the processor or processors of the controller 32 to implement one or more methods. For example, the controller 32 may obtain and process a measured electrical resistance value from the first circuit. The measured electrical resistance value may be output by the controller 32 to a device external to the plug, for example a user display device.

The computer readable storage medium may be any electronic, magnetic, optical, or other physical storage device. For example, the computer-readable storage medium may be, a random access memory (RAM), a static memory, a read-only memory (ROM), an electrically erasable programmable read-only memory (EEPROM), or a combination of one or more of these.

In some examples, the electrical plug 1 also includes an emitter 34 of an alert such as an audio alert or the emission of electromagnetic radiation. The emitter 34 may be an audible buzzer comprising a speaker. The emitter 34 may be a light source, such as a light-emitting diode (LED), for example. In other examples, the emitter 34 may be a transmitter which transmits an electromagnetic signal to a receiver, for example a radio frequency (RF) transmitter. The receiver may be a component of another device, for example. The emitter 34 may be communicatively coupled to the controller 32.

In examples, the controller 32 is configured to receive a measured resistance value from the first circuit 16 and control, based on the measured resistance value, an output of the emitter 34. For example, the controller 32 may be configured to adjust the output of the emitter 34 in response to a determination that the measured resistance value has a predetermined relationship with a resistance value threshold. In such examples, the measured resistance value is compared with the resistance value threshold. The predetermined relationship may comprise the measured resistance value being equal to; not equal to; greater than or equal to; greater than; less than or equal to; or less than; the resistance value threshold. The resistance value threshold may be predefined, for example set by a user and stored in memory accessible by the controller 32.

In some examples, the electrical plug 1 also includes a power source for providing electrical power to other components in the electrical plug 1, such as the controller 32 and/or the emitter 34. The power source may be an electrical power source, for example, a battery. The power source may be comprised within the electrical plug 1 or may be external to the electrical plug 1. Alternatively, the electrical plug 1 may comprise a connector for connecting to an external power source.

In an illustrative example, the predetermined relationship comprises the measured resistance value being greater than or equal to the resistance value threshold. The electrical resistance value measured by the first circuit 16 in this illustrative example is 15Ω and the resistance value threshold is predefined as 0.2Ω. Thus, it would be determined that the measured resistance value does have the predetermined relationship with the resistance value threshold, and so the controller 32 would adjust the output of the emitter 34 in response to that determination.

In examples, the controller 32 may adjust the output of the emitter 34 by changing a mode of the emitter 34, e.g. switching the emitter 34 from an 'off' mode, wherein no electromagnetic radiation is emitted by the emitter 34, to an 'on' mode, wherein electromagnetic radiation is emitted. In other examples, the controller 32 may adjust the output of the emitter 34 by changing the power of electromagnetic radiation, or the intensity of an audio output by the emitter 34.

The determination may be made by the controller 32, another component of the plug 1, or a component of a different device. For example, the controller 32 may determine whether the resistance value measured by the first circuit 16 has the predetermined relationship with the resistance value threshold. Alternatively, the measured resistance value may be communicated to a device external to the plug 1, e.g. directly or via the controller 32, and the external device may perform the determination and communicate the outcome to the controller 32. The controller 32 may then control the emitter 34 based on the outcome of the determination.

Figure 2:
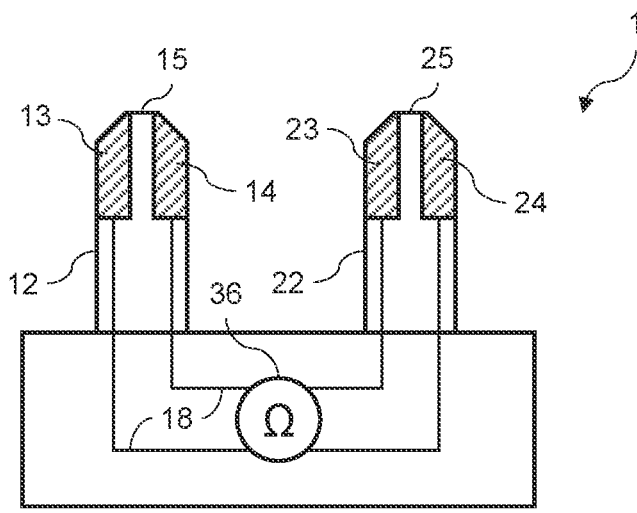

FIGS. 2 and 5 show examples of the electrical plug 1, according to the present invention, where the plug 1 includes a third circuit 36 connected to the first, second, third and fourth electrical contacts 13, 14, 23, 24 of the first and second pins 12, 22. Each of the electrical contacts 13, 14; 23, 24 may be connected to the third circuit 36 by separate electrical conductors 18, as shown in FIGS. 2 and 5. The third circuit 36 is configured to measure, by four-wire sensing, a resistance or an impedance of an electrical installation 10 connected to the electrical mains socket 2, e.g. when the plug 1 is engaged with the socket 2.

The electrical installation 10, shown connected to the mains socket 2 in FIG. 5, may comprise electrical wiring or cabling and associated devices such as switches, distribution boards, sockets and light fittings within a structure, connected to the mains, and for operation by end users. Electrical installations are typically regulated for safety and consistency, for example by the international IEC 60446 standard, and by the BS 7671 standard in the UK. The socket 2 may include a protective face plate 8, as shown in FIG. 5.

In contrast to two-wire sensing, four-wire, or four-terminal (4T), sensing uses two separate pairs of test leads, for example wires, to make two electrical connections on either side of the resistance-under-test. Two current (I) leads are used to supply a test current through the resistance-under-test, and two voltage (V) leads are used to measure a voltage drop across the resistance-under-test. The current leads may be referred to as source connections, and the voltage leads may be referred to as sense connections. Each pair of leads is connected across the resistance-under-test such that there is a source connection and a sense connection on each side of the resistance-under-test.

In this arrangement, the test current I does not flow through the voltage leads, nor the contacts between the voltage leads and the resistance-under-test. The voltage drop across the current contacts is also not measured by the voltage leads, e.g. by arranging each sense connection adjacent to a source connection. Therefore, there are negligible additional voltage drops due to lead and contact resistances, and a more accurate measurement of the resistance-under-test can be made compared to the 2T sensing technique.

4T sensing may be used for high-precision measurements of resistance and impedance, particularly for low values, for example below 1Ω. A particular type of connection, having two electrically isolated points of contact, for separate source and sense connections, is commonly referred to as a "Kelvin connection". Connectors providing such a Kelvin connection include so-called "Kelvin clamps" and "Kelvin clips". However, such connectors may pose difficulties when connecting an ohmmeter or impedance measurement device to an electrical mains socket, e.g. to measure an impedance of an electrical installation connected to the socket. Thus, 2T sensing is usually performed instead, which reduces the measurement accuracy as described above, and which may therefore involve additional, for example manual or semi-automatic, correction for the lead and contact resistances.

The two pins 12, 22 of the present electrical plug 1, each having isolated electrical contacts 13, 14; 23, 24, thus provide Kelvin connections which enable 4T sensing of an electrical installation 10 connected to an electrical mains socket 2. This allows for a more accurate measurement of electrical impedance compared to 2T sensing, and also measurements of an increased precision, for example with a resolution of around 1 milli-ohm (mΩ). In some cases, such as when measuring dead circuits, even greater precision may be possible, such as a resolution of 1 micro-ohm (μΩ) and below.

4T sensing also enables the use of test leads with built-in fuses, because the additional resistance of the fuses contributes a negligible measurement error. The use of fused leads may be desired feature because they can offer greater safety for users performing such electrical test measurements.

In some cases, if a defective socket contact is detected, for example using 2T sensing as described above, or there is a complete lack of contact on one side of the pin receptor 4, a three-wire measurement, wherein two wires 18 are connected to electrical contacts 13, 14 of the first pin 12, and one wire 18 is connected to one of the electrical contacts 23, 24 of the second pin 22 may be performable on such a socket 2. In other cases, a two-wire measurement may be performable on the socket 2 despite one or more defective socket contacts thereof. In examples, conducting wires 18 that connect to electrical contacts 13, 14; 23, 24 of the first pin 12 and/or the second pin 22 that are not being used for the alternative measurements can be short-circuited by the third circuit 36, e.g. inside the ohmmeter. Thus, the present plug with two multi-contact pins 12, 22 allows for carrying out some electrical resistance or impedance measurements even in the presence of an at least partially faulty socket 2.

In some examples of the present electrical plug 1, each different circuit that is present in the plug 1, e.g. one or more of the first, second and third circuits 16, 26, 36, has its own controller. Each controller may operate independently of, or in cooperation with, any other controller present. In other examples, a plurality of different circuits present in the plug 1, e.g. two or more of the first, second and third circuits 16, 26, 36, share a common controller 32.

In examples, one or more of the first circuit 16, the second circuit 26, the third circuit 36, the controller 32 or controllers, the power source, and the emitter 34 may be, where present, external to the plug 1 as part of an electrical testing system comprising the plug 1. As such, the electrical testing system, for testing an electrical mains socket 2, comprises the plug 1 according to any of the examples previously described. Corresponding descriptions shall be taken to apply.

In some examples, the plug 1 includes one or more circuits 16, 26, 36, connected to the corresponding contacts 13, 14, 23, 24 of the pin or pins 12, 22, as previously described. Each of the one or more circuits 16, 26, 36 that is present may be part of the plug 1 in the electrical testing system. Alternatively, each of the one or more circuits 16, 26, 36 may be external to the plug 1 while being connected to the corresponding contacts 13, 14, 23, 24 of the pin or pins 12, 22. In further examples, two or more circuits 16, 26, 36 that are present may be distributed in the electrical testing system such that at least one of the circuits 16, 26, 36 is part of the plug 1, and at least one of the circuits 16, 26, 36 is external to the plug 1.

In examples, one or more circuits 16, 26, 36 is external to the plug 1 and is part of an instrument, e.g. an ohmmeter device, connected to the plug by a cable. The conductors 18, e.g. wires, connecting the one or more circuits 16, 26, 36 to the corresponding contacts 13, 14, 23, 24 of the pin or pins 12, 22 may be incorporated in the said cable.

In some examples, the third circuit 36 connected to the four contacts 13, 14, 23, 24 of the two pins 12, 22 may comprise a plurality of modes. For example, in a first mode, the third circuit 36 is configured to measure an impedance via 4T sensing using the four wires 18 connecting the third circuit 36 to the separate contacts 13, 14, 23, 24 of the two pins 12, 22. In a second mode, the third circuit 36 may short the pair of wires 18 connecting the third circuit 36 to the contacts 23, 24 of the second pin 22. Thus, in the second mode, the third circuit 36 may operate as the first circuit 16, connected to the contacts 13, 14 of the first pin 12, as previously described. In a third mode, the third circuit 36 may short the pair of wires 18 connecting the third circuit 36 to the contacts 13, 14 of the first pin 12. Thus, in the third mode, the third circuit 36 may operate as the second circuit 26, connected to the contacts 23, 24 of the second pin 22, as previously described. In examples, the third circuit 36 may be comprised in an instrument, e.g. an ohmmeter, connected to the plug 1 via a cable and on which a user may change the mode of the third circuit 36 between its first, second and third modes, depending on the electrical test measurement that is to be performed.

Figure 7:
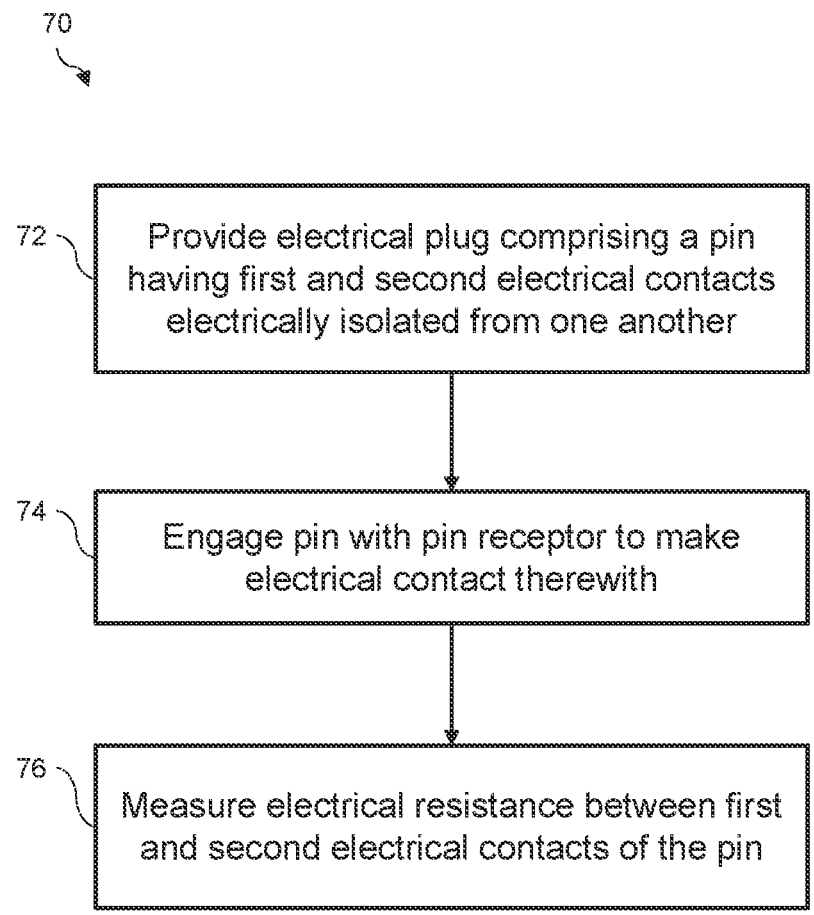
FIG. 7 is a flow chart illustrating a method of testing an electrical socket according to embodiments of the invention.

FIG. 7 is a flowchart showing a method 70 of testing an electrical socket comprising a pin receptor. The method 70 may be implemented on the electrical socket 2 comprising the pin receptor 4, as described previously with reference to FIGS. 3 to 5, for example.

The method 70 includes, at block 72, providing an electrical plug comprising a pin for engagement with the pin receptor. The electrical plug may comprise the electrical plug 1 comprising a pin 12 as described in previous examples with reference to FIGS. 1 to 5. Corresponding descriptions shall be taken to apply. The pin 12 comprises first and second electrical contacts 13, 14, each comprising a surface portion configured to engage with a different respective region of the pin receptor 4 when the pin 12 is engaged therewith. The electrical contacts 13, 14 are electrically isolated from one another at the pin 12, e.g. by galvanic isolation.

The method 70 includes, at block 74, engaging the pin 12 with the pin receptor 4 to make electrical contact therewith. For example, the plug 1 comprising the pin 12 may be inserted into the socket 2 comprising the pin receptor 4. With the pin 12 so engaged with the pin receptor 4, the surface portion of each of the isolated electrical contacts 13, 14 may make electric engagement with a different respective region of the pin receptor 4, e.g. different regions of the inner surface thereof.

The method 70 also includes, at block 76, measuring an electrical resistance between the first and second electrical contacts 13, 14, e.g. when the pin 12 is engaged with the pin receptor 4 to make electrical contact therewith. In some examples, the resistance is measured using a circuit connected to the first and second electrical contacts 13, 14, e.g. the first circuit 16 described in previous examples. The first circuit 16 may be part of an electrical testing system, and/or part of the plug 1, for performing the method 70.

In some examples, the method 70 further includes receiving a resistance value, measured by the circuit 16, and controlling, based on the measured resistance value, an output of radiation by an emitter. The radiation may be electromagnetic radiation such as a radio signal. Alternatively, an output of a light source or an audio alert may be controlled based on the resistance value. The emitter may be an emitter of electromagnetic radiation, of light, or of an audio alert or audio signal such as a tone or a buzz. The emitter may be an audio buzzer. These parts of the method 70 may be performed by a controller, for example the controller 32 described in previous examples of the electrical testing system and of the plug 1. The emitter may correspond to the emitter 34 previously described in examples, e.g. with reference to FIG. 4. The controller 32 and/or the emitter 34 may be part of the electrical testing system, and/or part of the plug 1, for performing the method 70.

In some examples, the method 70 further includes determining whether the resistance value, measured by the circuit 16, has a predetermined relationship with a resistance value threshold. Subsequently, in response to determining that the resistance value and the resistance value threshold have the predetermined relationship, the method involves adjusting the output of radiation by the emitter 34, for example adjusting the output of electromagnetic radiation, a light signal or an audio signal. These parts of the method 70 may also be performed by the controller 32, as previously described with reference to examples of the plug 1. As also described in previous examples, the predetermined relationship may comprise the measured resistance value being: equal to; not equal to; greater than or equal to; greater than; less than or equal to; or less than; the resistance value threshold. The resistance value threshold may be predefined, for example set by a user and stored in memory accessible by the controller 32.

Figure 6:
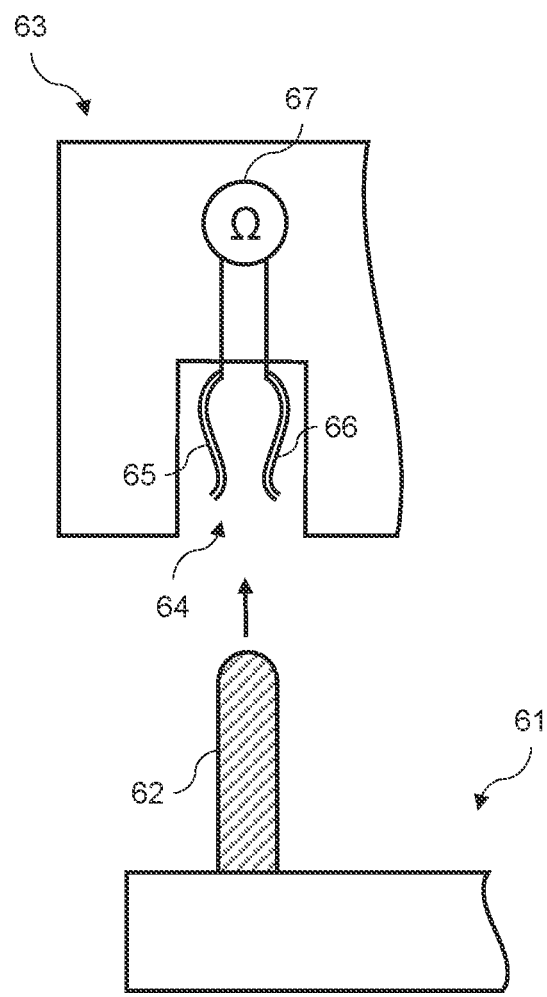
FIG. 6 is a schematic diagram of a sectional view of an electrical socket, interacting with an electrical plug, and for use in a method of testing the electrical plug according to embodiments of the invention.
Figure 8:
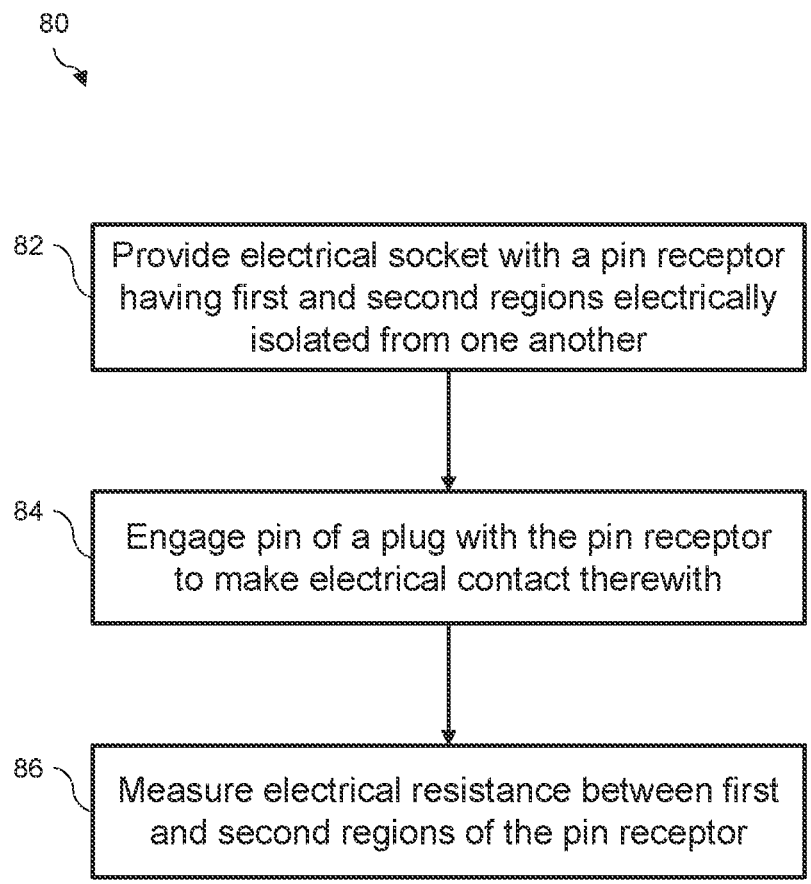
FIG. 8 is a flow chart illustrating a method of a method of testing an electrical plug according to embodiments of the invention.

FIG. 8 is a flowchart showing a method 80 of testing an electrical plug 61 comprising a pin 62, as depicted in FIG. 6. The electrical plug may be, in particular, an electrical mains plug. The method 80 includes, at block 82, providing an electrical socket 63 with a pin receptor 64 having first and second regions 65, 66 electrically isolated from one another, as depicted in FIG. 6, which shows the electrical socket 63 and the plug 61 as respective sections thereof. The plug 61, for example, may comprise more one or more pins 62. Similarly, the socket 63 may comprise one or more pin receptors 64. The first and second regions 65, 66, may be regions of different pieces of the pin receptor 64 in some examples. For example, the different pieces may be a first blade and second blade, as shown in FIG. 6. In other examples, the first and second regions 65, 66, may be regions of the same piece of the pin receptor 64. The first and second regions 65, 66 may be electrically isolated from one another by galvanic isolation.

In some examples, the first and second regions 65, 66 may be separated by an intermediate region of the pin receptor 64. For example, the intermediate region may comprise electrically insulating material to electrically isolate the first and second regions 65, 66 from one another.

The intermediate region may separate the first and second regions 65, 66 longitudinally, e.g. with respect to a longitudinal axis of the pin receptor 64. For example, electrically insulating material may be located at a joining of first and second blades of the pin receptor 64 to separate the first and second regions 65, 66 longitudinally with one region on each blade.

The method 80 includes, at block 84, engaging the pin 62 with the pin receptor 64 to make electrical contact therewith. For example, the plug 61 comprising the pin 62 may be inserted into the socket 63 comprising the pin receptor 64. With the pin 62 so engaged with the pin receptor 64, the electrically isolated first and second regions 65, 66 of the pin receptor 64 may each make electric engagement with the pin 62, e.g. with different portions of the outer surface thereof.

The method 80 also includes, at block 86, measuring an electrical resistance between the first and second regions 65, 66 of the pin receptor 64. In examples, the resistance is measured using a circuit 67, e.g. an ohmmeter, connected to the first and second regions 65, 66 of the pin receptor 64. In particular examples, the circuit 67 may a part of the socket 63. Alternatively, at least part of the circuit 67 may be external to the socket 63.

In some examples, the method 80 further includes receiving a resistance value, measured by the circuit 67, and controlling, based on the measured resistance value, an output of radiation by an emitter, for example an output of electromagnetic radiation, a light signal or an audio signal. These parts of the method 80 may be performed by a controller, e.g. similar to the controller 32 described in previous examples of the electrical testing system and of the plug 61. The emitter may similarly correspond to the emitter 34 previously described in examples. The controller may be part of the socket 63. Additionally or alternatively, the emitter may be part of the socket 63. In other examples, the controller and/or the emitter are external to the socket 63.

In some examples, the method 80 further includes determining whether the resistance value, measured by the circuit 67, has a predetermined relationship with a resistance value threshold. Subsequently, in response to determining that the resistance value and the resistance value threshold have the predetermined relationship, the method 80 involves adjusting the output of electromagnetic radiation by the emitter. These parts of the method 80 are similar to parts of the method 70 for testing an electrical socket described above. Corresponding descriptions shall thus be taken to apply.

The above embodiments are to be understood as illustrative examples. Further embodiments are envisaged. For example, a further embodiment of the electrical plug 1 is envisaged, comprising a multi-contact pin having four electrical contacts, isolated from one another at the pin, to engage with different regions of a pin receptor.

This would allow 4T sensing to be performed across a single pin receptor, giving a more accurate and precise measurement of the electrical resistance thereof, for example blade-to-blade, compared to 2T sensing. Such an approach, however, would double the number of wires 18 to be connected to each pin from the relevant circuit 16, 26, 36.

A further embodiment of the electrical plug 1 is envisaged wherein the multi-contact pins each comprise two spring-loaded electrical contacts. Thus, for electrical sockets 2 comprising pin receptors 4, 6 with single blades, the spring-loaded electrical contacts of a given pin can engage with different regions of a corresponding pin receptor, and 4T sensing can still be performed as described.

What is claimed is:

1. An electrical plug for testing an electrical mains socket, when engaged therewith, the electrical plug comprising a first pin for inserting into a first pin receptor of the electrical mains socket and a second pin for inserting into a second pin receptor of the electrical mains socket,
   wherein the first pin comprises first and second electrical contacts, each comprising a surface portion to electrically engage with a different respective region of an inner surface of the first pin receptor of the electrical mains socket when the first pin is inserted into the first pin receptor, the first and second electrical contacts being electrically isolated from one another at the first pin, and
   wherein the second pin comprises third and fourth electrical contacts, each comprising a surface portion to electrically engage with a different respective region of an inner surface of the second pin receptor of the electrical mains socket when the second pin is inserted into the second pin receptor, the third and fourth electrical contacts being electrically isolated from one another at the second pin.

2. The electrical plug of claim 1, comprising a first circuit connected to the first and second electrical contacts, and configured to measure an electrical resistance therebetween.

3. The electrical plug of claim 1, wherein at least one of the following applies:
   the first and second electrical contacts are separated by an intermediate portion of the first pin; or
   the first and second electrical contacts are diametrically opposed to one another.

4. The electrical plug of claim 1, comprising a second circuit connected to the third and fourth electrical contacts, and configured to measure an electrical resistance therebetween.

5. The electrical plug of claim 2, comprising:
   a controller; and
   an emitter of radiation,
   wherein the controller is configured to:
     receive a measured resistance value from the first circuit; and
     control, based on the measured resistance value, an output of the emitter.

6. The electrical plug of claim 5, wherein at least one of the following applies:
   the emitter is a light source or a transmitter of electromagnetic radiation or an emitter of an audio alert; or the controller is configured to adjust the output of the emitter in response to a determination that the measured resistance value has a predetermined relationship with a resistance value threshold.

7. The electrical plug of claim 1, comprising a third circuit connected to the first, second, third and fourth electrical contacts, and configured to measure, by four-wire sensing, at least one of an impedance and a resistance of an electrical installation connected to the electrical mains socket.

8. An electrical testing system for testing an electrical mains socket, the testing system comprising:
an electrical plug comprising a first pin for inserting into a first pin receptor of the electrical mains socket and a second pin for inserting into a second pin receptor of the electrical mains socket,
wherein the first pin comprises first and second electrical contacts, each comprising a surface portion to electrically engage with a different respective region of an inner surface of the first pin receptor of the electrical mains socket when the first pin is inserted into the first pin receptor, the first and second electrical contacts being electrically isolated from one another at the first pin, and
wherein the second pin comprises third and fourth electrical contacts, each comprising a surface portion to electrically engage with a different respective region of an inner surface of the second pin receptor of the electrical mains socket when the second pin is inserted into the second pin receptor, the third and fourth electrical contacts being electrically isolated from one another at the second pin;
a first circuit connected to the first and second electrical contacts and configured to measure a first electrical resistance therebetween; and
a second circuit connected to the third and fourth electrical contacts and configured to measure a second electrical resistance therebetween.

9. The electrical testing system of claim 8, wherein at least one of the following applies:
the first and second electrical contacts of the first pin are separated by an intermediate portion thereof; or
the first and second electrical contacts are diametrically opposed to one another.

10. The electrical testing system of claim 8, comprising:
a controller; and
an emitter of radiation,
wherein the controller is configured to:
receive a measured resistance value from the first circuit; and
control, based on the measured resistance value, an output of the emitter.

11. The electrical testing system of claim 10, wherein at least one of the following applies:
the emitter is a light source or a transmitter of electromagnetic radiation or an emitter of an audio alert; or
the controller is configured to control the output of the emitter in response to a determination that the measured resistance value has a predetermined relationship with a resistance value threshold.

12. The electrical testing system of claim 8, comprising a third circuit connected to the first, second, third and fourth electrical contacts and configured to measure, by four-wire sensing, at least one of an impedance and a resistance of an electrical installation connected to the electrical mains socket.

13. A method of testing an electrical mains socket comprising a first pin receptor and a second pin receptor, the method comprising:
providing an electrical plug comprising a first pin for inserting into the first pin receptor of the electrical mains socket and a second pin for inserting into a second pin receptor of the electrical mains socket,
wherein the first pin comprises first and second electrical contacts, each comprising a surface portion to electrically engage with a different respective region of an inner surface of the first pin receptor when the first pin is inserted into the first pin receptor, the first and second electrical contacts being electrically isolated from one another at the first pin, and
wherein the second pin comprises third and fourth electrical contacts, each comprising a surface portion to electrically engage with a different respective region of an inner surface of the second pin receptor of the electrical mains socket when the second pin is inserted into the second pin receptor, the third and fourth electrical contacts being electrically isolated from one another at the second pin;
engaging each pin with the respective pin receptor to make electrical contact therewith; and
measuring a first electrical resistance between the first and second electrical contacts and a second electrical resistance between the third and fourth electrical contacts.

14. The method of claim 13, comprising:
receiving a measured resistance value measured by a circuit connected to the first and second electrical contacts; and
controlling, based on the measured resistance value, an output of radiation by an emitter.

15. The method of claim 14, comprising:
determining whether the measured resistance value has a predetermined relationship with a resistance value threshold; and
adjusting, in response to determining that the measured resistance value and the resistance value threshold have the predetermined relationship, the output of radiation by the emitter.

* * * * *